United States Patent [19]

Sapru et al.

[11] Patent Number: 4,511,638
[45] Date of Patent: Apr. 16, 1985

[54] PHOTORESPONSIVE AMORPHOUS SEMICONDUCTOR MATERIALS, METHODS OF MAKING THE SAME, AND PHOTOANODES MADE THEREWITH

[75] Inventors: Krishna Sapru, Troy; Benjamin Reichman, Birmingham; Gao Liang, Detroit, all of Mich.

[73] Assignee: Energy Conversion Devices, Inc., Troy, Mich.

[21] Appl. No.: 499,900

[22] Filed: Jun. 1, 1983

[51] Int. Cl.³ .................... H01M 6/36; C25B 11/10
[52] U.S. Cl. .................................. 429/111; 204/37.1; 204/130; 204/140; 204/192 P; 204/192 S; 204/242; 204/290 R; 204/DIG. 3; 252/62.3 BT
[58] Field of Search ............. 204/37 R, 130, 140, 204/192 S, 192 P, 290 R, 242, DIG. 3; 252/62.3 R, 62.3 E, 62.3 ZT, 62.3 V, 62.3 BT, 501.1; 429/111

[56] References Cited

PUBLICATIONS

P. Clechet et al, *J. Electrochem. Soc.*, vol. 130, pp. 1795–1796, (1983).
J. P. Frayret et al, "*Electrochimica Acta*", vol. 27, pp. 1525–1528, (1982).
M. F. Weber et al, *J. Electrochem. Soc.*, vol. 129, pp. 2022–2028, (1982).
J. J. Cuomo et al, *IBM Tech. Disc. Bull.*, vol. 19, p. 2359, (1976).
Y. Matsumoto et al, *J. Electrochem. Soc.*, vol. 128, pp. 1040–1044, (1981).
K. Rajeshwar et al, *Electrochimica Acta*, vol. 23, p. 1126, (1978).

*Primary Examiner*—Aaron Weisstuch
*Attorney, Agent, or Firm*—Lawrence G. Norris

[57] ABSTRACT

A photoresponsive amorphous semiconductor material is modified by incorporating at least one compensating agent selected from a group consisting of hydrogen, lithium, fluorine, beryllium, aluminum, boron, magnesium, other Group I elements, and compounds of these elements. The semiconductor material is cathodically treated either simultaneously with or subsequent to this modification. The semiconductor material may be additionally modified by incorporating a second modifying agent selected from a group consisting of silicon, the transition elements, the lanthanides, and compounds of these elements. The semiconductor material also may be subjected to heat treatment in an inert atmosphere before the cathodic treatment.

A photoanode utilizing the above described semiconductor material further includes a substrate to support a film of said material. The photoanode may additionally include a second semiconductor film having a small band gap inserted between said substrate and said first semiconductor film. These photoanodes may be used in an electrochemical cell for the conversion of light into electrical energy or energy stored in a fuel.

42 Claims, 7 Drawing Figures

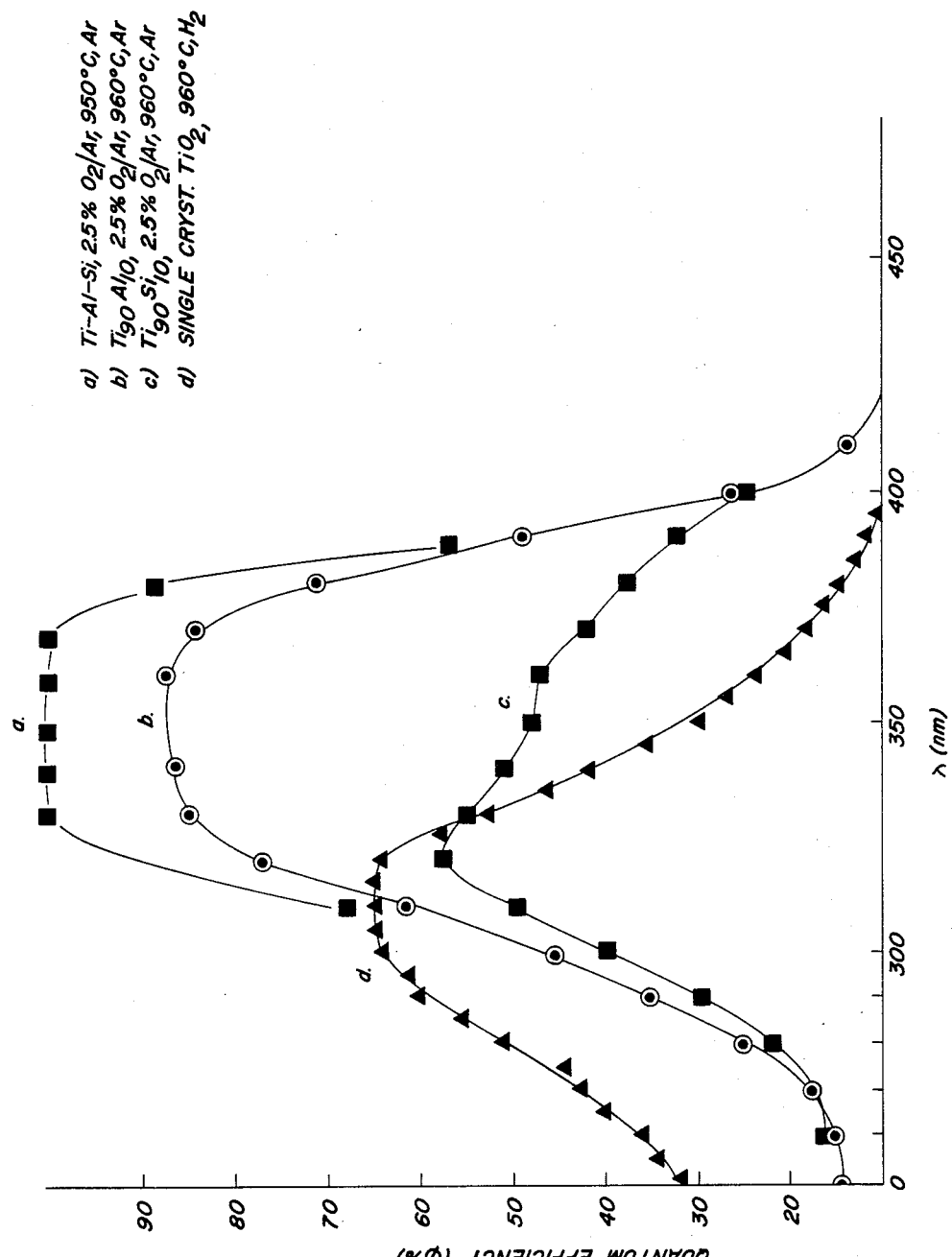

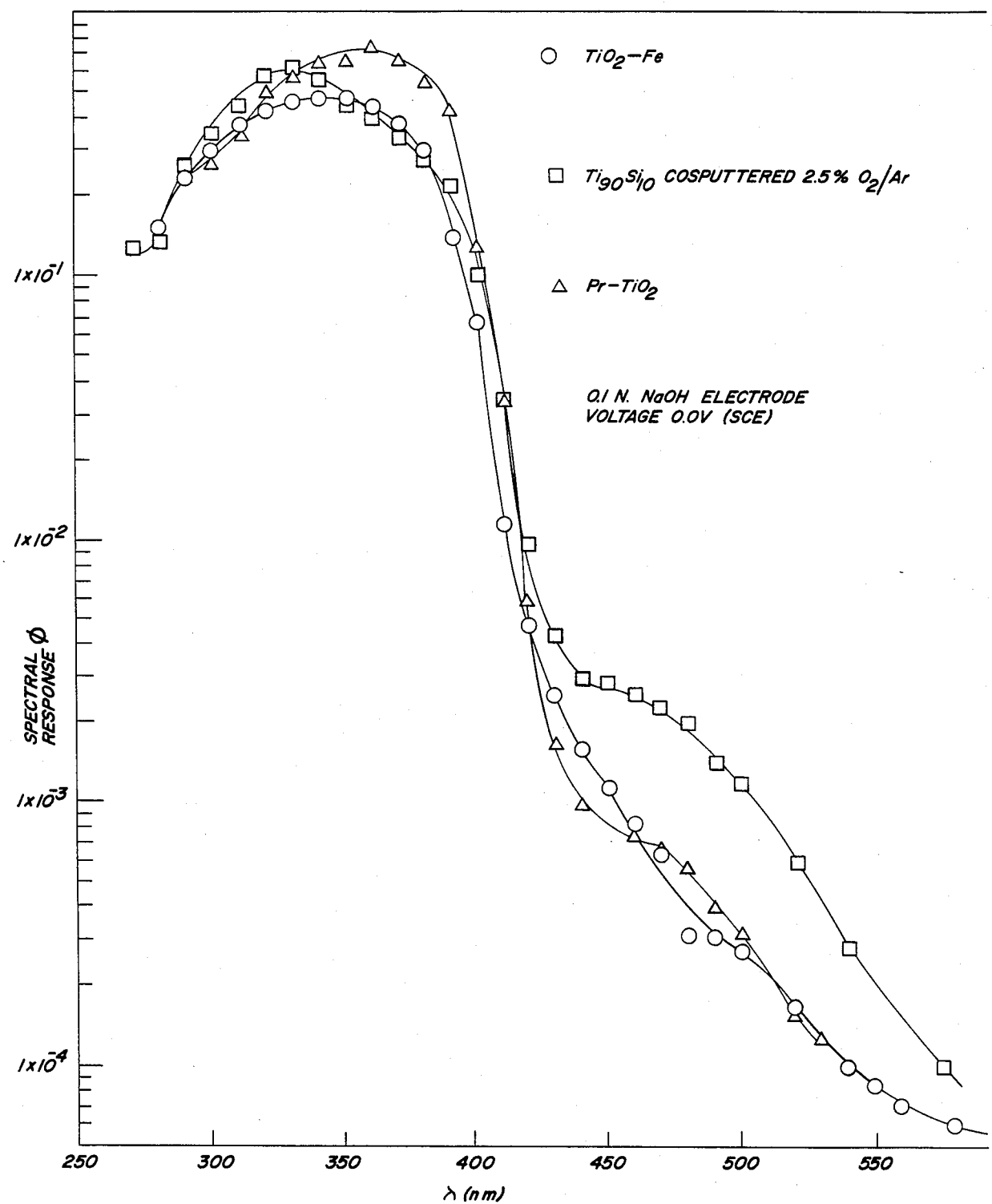

PHOTORESPONSIVE AMORPHOUS SEMICONDUCTOR MATERIALS, METHODS OF MAKING THE SAME, AND PHOTOANODES MADE THEREWITH

BACKGROUND OF THE INVENTION

This invention relates generally to photoresponsive amorphous semiconductor materials and more specifically to cathodically treated n-type amorphous semiconductors as photoanodes for use in the photoelectrolysis of water and conversion of light to electrical energy.

Using conventional metal electrodes, the electrolysis of an aqueous electrolyte solution requires a potential of at least 1.23 volts from an external power source to cause the desired reaction to occur. Neglecting overvoltages which arise from energy barriers at the electrodes, this potential is required to shift the Fermi level of the metal anode to the energy level at which oxidation of water occurs ($H_2O/O_2$) and to shift the Fermi level of the metal cathode to the energy level at which reduction of water occurs ($H_2O/H_2$).

The generation of hydrogen using a photoanode in an electrochemical cell requires at least one counter electrode in an electrolyte. The electrochemical cell can utilize either a photocathode or a conventional metal cathode with the photoanode. The electrolyte may be either acidic or alkaline. When the electrolyte is acidic, the reaction at the counter electrode is:

(a) $2H^+ + 2e^- \rightarrow H_2$. 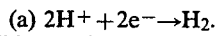

This reaction proceeds in the dark as sufficient electrons are available. At the photoanode, the reaction is:

(b) $H_2O + 2h^+ \rightarrow 2H^+ + \frac{1}{2} O_2$. 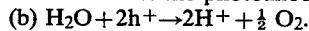

When the electrolyte is alkaline, the reaction at the counter electrode is:

(c) $H_2O + e^- \rightarrow \frac{1}{2} H_2 + OH^-$ 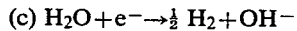

and the reaction at the photoanode is:

(d) $2OH^- + 2h^+ \rightarrow H_2O + \frac{1}{2} O_2$. 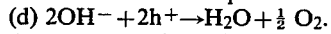

As an example, when an n-type semiconductor photoanode is exposed to light, the electrons are excited from the valence band to the conduction band, thereby creating holes in the valence band and free electrons in the conduction band. The electrons produced at the photoanode are conducted by means of an external electrical connection to the counter electrode where the electrons combine with hydrogen ions of water molecules in the electrolytic solution to produce hydrogen gas. At the photoanode, the electrons are provided from the hydroxyl ions in the solution to fill the holes created by the excited electrons of the photoanode and evolve oxygen.

To create a good charge separation between the electrons and holes at the photoanode, a positive potential, for example, 0.5 volts, is applied to bend the conduction and valence bands. This creates a field to prevent electrons excited to the coduction band from recombining with the holes created in the valence band upon the absorption of light energy. The bank bending also tends to direct the excited electrons into the electrical circuit and the holes to the surface of the photoanode where they can combine more readily with hydroxyl ions provided by the electrolyte.

By selecting a semiconductor with a conduction band level more negative than the $H_2O/H_2$ energy level, the electrolysis of water can be accomplished solely through the use of solar energy. At least a portion of the electrode potential of the reaction can be supplied by light to reduce the energy required from an external power source.

For optimum efficiency, the semiconductor utilized for the photoanode should have a band gap in the approximate range of 1.5 to 1.7 eV with a Fermi level which is compatible with the electrolytic solution. For an n-type semiconductor, the water elctrolysis process proceeds best when the semiconductor has a band gap slightly greater than 1.5 eV. A small work function also is desirable so that electrons diffuse into the water to attain thermal equilibrium. This causes the energy bands of the semiconductor to bend up near the interface of the electrolyte. The incident light is then absorbed in the semiconductor creatng electron-hole pairs. The photoexcited holes are accelerated towards the semiconductor-electrolyte interface by the internal field. When holes are injected into the water at the correct energy, oxygen is evolved near the photoanode and hydrogen is evolved near the counter electrode according to the reactions previously described in equations a and b, or c and d, depending upon whether an acidic or alkaline system is utilized.

In addition to utilization of an acidic or alkaline elctrolyte for the direct production of hydrogen, a redox couple can also be used for the electrolyte. The redox couple is utilized for the direct production of electricity instead of producing hydrogen gas. The redox couple is selected to have a chemical potential within the band gap of the photoanode. A detailed discussion of the operation of cells utilizing a photoanode, a photocathode, or both to convert solar energy into electrical energy is contained in the article entitled "Conversion of Sunlight into Electrical Power and Photoassisted Electrolysis of Water in Photoelectrochemical Cells" by Adam Heller in *Accounts of Chemical Research*, Volume 14, published in 1981.

Prior photoanodes have been very inefficient, unstable or otherwise unsuitable for commercial application. Specifically, crystalline or polycrystalline semiconducting oxides such as $TiO_2$, $WO_3$, $Fe_2O_3$, or $SrTiO_3$ are stable under conditions of electrolysis but as a result of their large band gaps, i.e. 3.0 eV or greater, the conversion efficiencies are very small and not useful in a practical sense.

For example, a photoanode with a band gap of 1.5 eV can potentially utilize approximately 40% of the total solar energy available in the visible light spectrum. A photoanode having a band gap of 3.0 eV can potentially utilize only energy at the ultraviolet wavelength, amounting to approximately 3% of the total solar energy available. While such devices may have high quantum efficiency, the amount of total solar energy converted to electricity is quite low.

Attempts have been made to improve the conversion efficiencies of semiconductor materials. When a transition metal element is introduced into a crystalline or polycrystalline material, there is some improvement in the materials ability to utilize solar energy in the visible region of the spectrum.

For example, a polycrystalline $TiO_2$ substrate may be sprayed with a salt solution of nickel and chromium nitrate, followed by the thermal decomposition of the salt solution. The resulting material was reported in the *Journal of the Electrochemical Society*, Vol. 127, page 1567 (1980) to have a slight shift of the band gap toward the visible light range and thus allowed a very small amount of additional solar energy to be utilized. The quantum efficiency of the material in the ultraviolet range, however, was greatly reduced from the level obtained before the addition of chromium. Thus, the overall conversion efficiency of the material was much lower.

The article "Electrochemical Activation of Rutile Electrode Photosensitivity" *Elektrokhimiya*, Vol. 13, No. 2, p. 309, February 1977 by Asatiani, et al. reports an increase in photoactivity of electrodes made with a film of rutile $TiO_2$ by the heating of the crystalline film in a reducing atmosphere and by subjecting the crystalline film to cathodic polarization. The increase in photoactivity, however, was due to the oxidation of the titanium substrate, thereby increasing the concentration of oxygen vacancies in the semiconductor, and would decrease over several days.

Another attempt to produce photoanodes is reported in "Photoelectrochemical And Impedance Properties of Sputtered Oxides" *SERI Abstract*, August, 1980 by Weber et al., in which $TiO_2$ films sputtered in a pure oxygen atmosphere resulted in a crystalline structure. These films were electrochemically doped with hydrogen. Even though higher photocurrents were initially obtained the $TiO_2$ films also lost hydrogen through illumination bleaching and reversible doping which seriously affected their performance.

In general, modification of single crystal materials attempted in the prior art have been restricted by two conditions: (1) the dopant must have electronic energy levels within the band gap of the parent material, (2) the dopant must have a crystalline structure isomorphous with the parent oxide. Attempts to induce the solar energy absorption range into the visible light region generally result in the introduction of localized states in the gap and a drastic reduction in the photoresponse.

In addition to these oxides, attempts have been made to use other materials having smaller band gaps, for example, single crystal silicon, which has a band gap of 1.1 eV. These materials, however, are not stable under conditions of photoelectrolysis. Intense corrosion renders the photoanode useless after only a brief exposure to the electrolyte.

In accordance with the present invention, photoanodes are fabricated utilizing cathodically treated amorphous semiconductors. Amorphous semiconductors are particularly useful because of the independent control that one has over the work function, Fermi level and energy gap. The amorphous semiconductors modified in accordance with the present invention are as photoresponsive as crystalline semiconductors but less expensive and more easy to produce. The photoanodes contemplated herein resist corrosion by their environment. The photoanodes also have an improved stability in terms of operating life and shelf life by comparision to the prior art. The present invention alleviates the problems discussed above by improving the quantum efficiency of photoanodes in the visible region of the spectrum without decreasing the quantum efficiency in the ultraviolet region. Furthermore, the present invention can be used to significantly improve the corrosion resistance of low band gap semiconductors without a consequential loss of quantum efficiency.

SUMMARY OF THE INVENTION

The present invention includes cathodically treated amorphous semiconductors, methods of making the same, and photoanodes made therewith. The photoanodes may be utilized for the photoelectrolysis of water and conversion of light into electrical energy. The problems in prior photoanodes as discussed above are obviated by the present invention, all without deleterious consequences.

A method of making a photoresponsive amorphous semiconductor material includes the steps of forming an amorphous semiconductor and cathodically treating the amorphous semiconductor so that a compensating agent modifies the semiconductor to eliminate or compensate the localized states and enhance the photoresponse of the semiconductor. The method may include modifying the semiconductor by incorporating therein at least one compensating agent selected from the group consisting of hydrogen, lithium, fluorine, beryllium, aluminum, boron, magnesium, other Group I elements, and compounds of these elements. Furthermore, the amorphous semiconductor is preferably subjected to a heat treatment before the treating step.

The method also may include incorporating a modifying agent in the amorphous semiconductor prior to the cathodically treating step. The modifying agent is selected from a group consisting of silicon, the transition elements, lanthanides, and compounds of these elements.

In one embodiment, a photoanode having enhanced photoresponse includes a substrate having a deposition surface. An amorphous semiconductor film is in electrical contact with the deposition surface. The semiconductor film is prepared in accordance with the above described invention.

In another embodiment, a tandem photoelectrode is prepared by inserting a small band gap semiconductor material between the above described substrate and amorphous semiconductor film.

Still another embodiment of the invention, a photoelectrochemical cell for the conversion of light into electrical energy or energy stored in a fuel includes a cell having an interior space therein. The space is divided by a membrane positioned in the space to form an anode compartment and a counter electrode compartment within the cell. An electrolyte is placed in the anode compartment and in the counter electrode compartment. A counter electrode is positioned in the counter electrode compartment with at least a portion in contact with the electrolyte. A photoanode, as described above, is positioned in the anode compartment with at least a portion in contact with the electrolyte. The photoelectrochemical cell also includes means for allowing light to enter the cell and illuminate the photoanode wherein the light will have access to the photoanode to be converted into energy usable as electricity or a fuel.

DESCRIPTION OF THE DRAWINGS

FIG. 6 is a plot of the quantum efficiency (%) vs. wavelength for hydrogenated amorphous $TiO_2$ films modified with (a) aluminum and silicon, (b) aluminum and (c) silicon illustrating the increase in quantum efficiencies due to modification with a second modifying agent and a second compensating agent in comparison to (d) single crystal $TiO_2$; and FIG. 7 is a plot of the photospectral response vs. wavelength for amorphous $TiO_2$ film co-sputtered with silicon and two amorphous $TiO_2$ films chemically modified with iron or praseodymium illustrating the increase in photoresponse due to modification with a second modifying agent.

DETAILED DESCRIPTION OF THE PREFERRED EMBODIMENTS

Figure 1:
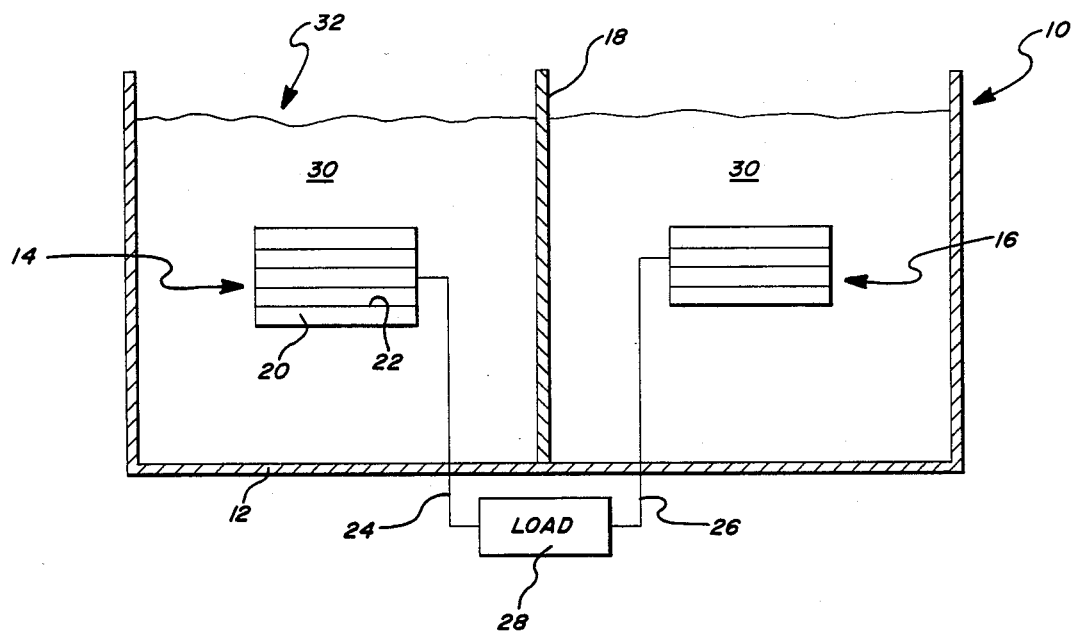
FIG. 1 is a schematic representation of an electrochemical cell which incorporates a photoanode and a counter electrode in accordance with the invention.

Referring to FIG. 1, a photochemical cell 10 for the photoelectrolysis of water is illustrated. The cell 10 includes a container 12 with a photoanode 14 and a counter electrode 16 immersed in an electrolyte. The two electrodes are separated by a membrane 18. The photoanode has a substrate 20 with a deposition surface 22. The substrate 20 can be stainless steel or any other material which provides a conductive support. Preferably, titanium or stainless steel tin oxide coated glass (NESA glass) is utilized as the substrate material.

In accordance with the invention, the photoelectrochemical device 10 illustrated has a photoanode 14 constructed in a manner described below. A pair of suitably electrically conductive leads 24 and 26 ae attached between the photoanode 14, counter electrode 16, and a load 28. A suitable electrolyte 30 is then placed in the container 12 to cover the photoanode 14 and counter electrode 16. Light 32 is allowed to enter the cell 10 from the top of the container 12 to illuminate the photoanode and photoelectrolysis will occur according to the above described reactions.

A photoanode has been utilized above described cell for the conversion of light into electrical energy. In photoelectrolysis, the operation can be assisted by replacing the load 28 with a source of electrical power.

In the preparation of photoanodes of the present invention, deposition techniques such as sputter or evaporation deposition and plasma or glow discharge deposition can be utilized to deposit an amorphous semiconductor layer on the substrate deposition surface 22. These techniques allow for selectively incorporating a modifier in the host matrix of the semiconductor material by deposition. Thus, amorphous semiconductor materials are tailor-made in accordance with the present invention to improve their photoresponse and other advantages cited herein.

Some of these techniques and specific amorphous semiconductors are disclosed in U.S. Pat. Nos. 4,217,374; 4,226,898 and 4,342,044 assigned to the assignee of record in this application, which are incorporated herein by reference. The n-type amorphous semiconductor is preferably titanium dioxide. Other n-type amorphous semiconductor materials contemplated by the present invention include, but are not limited to, the oxides, selenides, sulfides, and phosphides of the transition elements. More particularly, $Fe_2O_3$, $SrTiO_3$, $WO_3$, and n-doped Si:F:H alloys are contemplated.

A number of parameters effect the amorphocity of the deposited film, i.e., temperature, percentage of oxygen contained in the sputtering atmosphere, sputtering power. In general, the sputtering power may be in the range of $\frac{1}{2}$ watt/cm$^2$ to 2 watts/cm$^2$ and preferably 1 watt/cm$^2$, as excessive power will tend to form an undesirable substantially polycrystalline film. The temperature of the substrate during co-sputtering usually was held in the range of approximately 20° C. to 80° C.

The stoichiometry of the preferred amorphous semiconductor films prepared by reactive co-sputtering, in accordance with the present invention, can easily be controlled by changing the partial pressure of the oxygen atmosphere, sputtering power and deposition of substrate temperature. The degree of disorder of the preferred amorphous semiconductor films can be controlled by varying the oxygen partial pressure, deposition temperature, and the sputtering power.

The photoresponse of amorphous semiconductor films may be significantly enhanced by modification with a compensating agent incorporated in the semiconductor film. The compensating agent compensates or eliminates the localized states in the band gap of the material which would otherwise have a detrimental effect upon the photoresponse of the semiconductor material. Although the present invention contemplates the use of any agent which effectively compensates for the localized states in the band gap of the material, the following materials are particularly useful for accomplishing these means: hydrogen, lithium, fluorine, beryllium, aluminum, boron, magnesium, other Group I elements, and compounds made with these elements. Preferably, the compensating agent is present in an amount of about one atomic percent.

One of the preferred methods of modifying an amorphous semiconductor with a compensating agent is through electrochemical compensation. After the semiconductor film is formed as described above, it is modified by cathodic treatment. This treatment is accomplished by placing the semiconductor film in an electrolyte and applying an electrical bias for several minutes. The preferred electrolyte is sodium hydroxide with a concentration of about 0.1M. Other suitable electrolytes are, for example, lithium hydroxide and potassium hydroxide. An appropriate electrical bias is between $-1.2$ to 2.0 volts applied for not more than about 10 minutes. When the preferred compensating agent, hydrogen, is used to modify the semiconductor film during cathodic treatment, it is referred to as hydrogenation.

A second preferred method of modifying the amorphous semiconductor with a compensating agent is by co-sputtering. During the formation of the semiconductor film, a compensating agent is simultaneously sputtered with the semiconductor material to codeposit a film. Subsequently, the compensated amorphous semiconductor film is subjected to the cathodic treatment described above.

Whether amorphous semiconductor materials can be used as photoanodes and effective photocatalysts to convert light into electrical energy depends on their band gap and flat-band potentials in the electrolyte. Materials of small band gap and more negative flat-band potential are suitable for use as photoanodes.

The amount of charge associated with the enhancement of the photocurrent was measured on an electrode made with an amorphous titanium dioxide film in accordance with the present invention. First the voltage of this electrode was taken to a negative value in the dark for hydrogenation (approximately 3 minutes at about −1.6 volts with respect to S.C.E.). Secondly the electrode was taken to an anodic potential (+0.3 volts) before water oxidation in the dark takes place. Then the photocurrent was measured.

Since the performance with this electrode decays with time, the decay in the dark current was recorded together with the counting of the charge during continuous photoelectrolysis using a coulombmeter. The amount of charge involved in the enhancement of the photocurrent was much more than what would account for the surface hydrogen adsorption process. The charge which is involved in this process is associated with the bulk of the film and it was calculated to be approximately six atomic percent of hydrogen in the titanium dioxide matrix. This indicates the formation of an alloy of titanium-oxygen-hydrogen.

The present invention improves the stability of the materials disclosed herein by heating the semiconductor films prior to cathodic treatment. The heat treatment or annealing takes place in an inert atmosphere, preferably argon or nitrogen. A suitable temperature range is about 200° C. to 400° C. for about 30 minutes. The preferred temperature range is about 200° C. to 250° C.

In general, the width of the band gap and the stability of the photoelectrode used in water electrolysis is correlated; the smaller the band gap, the more unstable the photoelectrode is; the larger the band gap, the more stable it is. Small band gap materials however, are usually more photoresponsive to visible light than larger band gap materials.

Many of the modified semiconductor materials of the present invention have large band gaps. Because of their stability in photoelectrolysis application, these modified semiconductor materials may be utilized as a protective window coating over small band gap materials to make a tandem photoanode. Such a coating may be sufficiently thick to protect the small band gap material from corrosion, yet leave the overall quantum efficiency of the tandem photoanode unaffected.

One of the methods of making a tandem photoanode using modified semiconductor materials of the present invention is by sputtering or co-sputtering the large band gap material on the small band gap material. The tandem photoanode is then subjected to the cathodic treatment discussed above. Preferably, amorphous titanium dioxide is used as the modified semiconductor material having the large band gap.

Through the modification of amorphous $TiO_2$ with an element like hydrogen, the conversion efficiencies are as good as the best results achieved with single crystal $TiO_2$. To further improve the conversion efficiencies of materials contemplated by the present invention, the band gap of these materials can be reduced by a second class of modifying agent incorporated into the amorphous semiconductor.

The second class of modifying agents includes silicon, transition elements, lanthanides, and compounds of these elements. The preferred elements are silicon, chromium, iron, niobium, and praseodymium. The preferred amount incorporated in the amorphous semiconductor is not more than about 20 atom percent.

Unless otherwise indicated in the example, all photoresponse measurements herein are taken against a saturated calomel electrode (0.0 v) in a 0.1M NaOH electrolyte at room temperature under illumination of a xenon lamp adjusted to 100 ms/cm$^2$.

EXAMPLE 1

Titanium targets were used to reactively sputter three titanium substrates using different oxygen partial pressures i.e 1%, 2.5%, 5% $O_2$/Ar at a constant sputtering power and different substrate temperatures. A reactive sputtering atmosphere containing approximately 2.5% oxygen in argon and a substrate temperature of 20° C. to 80° C. provided the most photoresponsive material. Increasing the oxygen partial pressure clearly increased the degree of crystallinity in the film as shown by X-ray diffraction studies.

Figure 2:
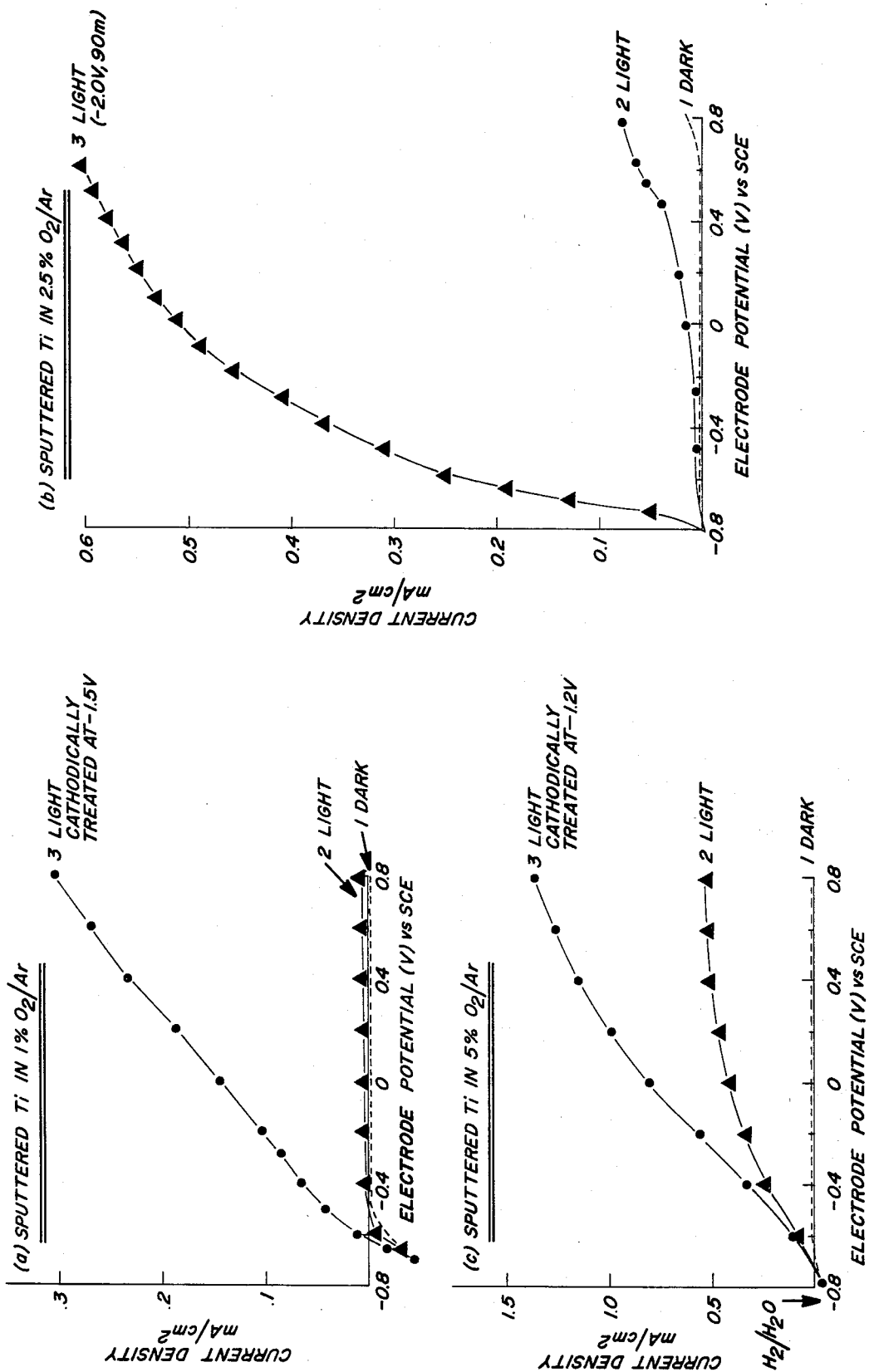
FIG. 2 is a plot of current density vs. electrode potential for amorphous $TiO_2$ reactively sputtered at three different oxygen partial pressures: (a) 1% $O_2/Ar$, (b) 2.5% $O_2/Ar$, and (c) 5% $O_2/Ar$, illustrating the effect of different degrees of amorphocity on photoresponse.

These films were subsequently hydrogenated for 90 minutes. The following bias potentials were used: (a) −1.5 v; (b) −2.0 v; (c) −1.2 v. The photocurrent of the resulting film dramatically increased in comparison to the untreated films as illustrated in FIGS. 2a–2c. The more crystalline the untreated film is, the larger the original photocurrent. The effect of hydrogenation, however, is largest on the more amorphous films. For example, FIG. 2a illustrates a substantial increase in photocurrent for the most amorphous film due to hydrogenation. The most crystalline film (FIG. 2c), showed a smaller increase in photocurrent.

EXAMPLE 2

To see if the effect of cathodic treatment was primarily associated with the amorphous nature of the film or its stoichiometry, a number of photoanodes were prepared by reactive R.F. sputtering in a 2.5% $O_2$/Ar atmosphere to yield films of amorphous $TiO_2$ on titanium substrates having identical stoichiometries. These films were annealed in an argon atmosphere at various temperatures in the range of 120° C. to 400° C. for 30 minutes. Each of these annealed films was then subjected to cathodic treatment at −1.6 v for 3 minutes. The photocurrent-voltage characteristics of these films are present in FIG. 3. Those films annealed in the temperature range of 200° C. to 400° C., and more particularly at 210° C., showed a dramatic improvement in stability over cathodically treated amorphous $TiO_2$ films which were not annealed.

Figure 3:
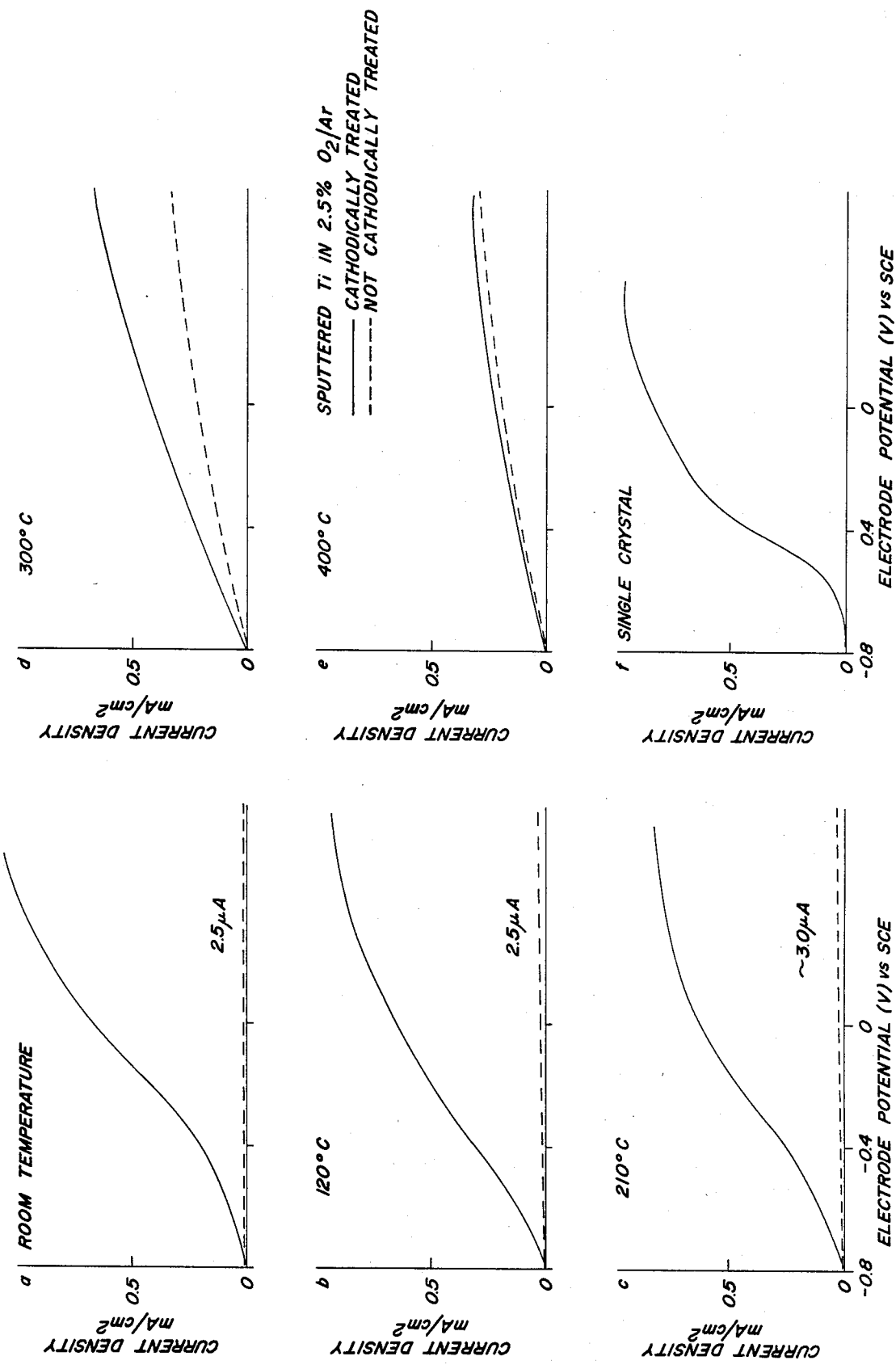
FIG. 3 is a plot of photocurrent vs. electrode potential (vs. S.C.E.) for cathodically treated amorphous $TiO_2$ films annealed for 30 minutes at (a) room temperature, (b) 120° C., (c) 210° C., (d) 300° C., (e) 400° C., and (f) single crystal, illustrating the effect of hydrogenation at different annealing temperatures.

As is illustrated in FIG. 3, the more amorphous the film is, the larger the effect of the hydrogenation process. Moreover, the photocurrent for the most amorphous electrode after hydrogenation was higher than the film annealed at 400° C. also treated with the hydrogenation process (compare FIG. 3 a vs. e). The photocurrent of the modified electrode is quite stable. During anodic polarization in the light, or in the dark, the photocurrent decreases very slowly. Leaving the cell at open circuit potential or in air for a period of two weeks, the photocurrent decreased by a factor of 3 to 5, but upon short cathodic treatment, the photocurrent was restored to the original value. The photocurrent with single crystal $TiO_2$ electrode, on the contrary, decreased upon cathodic reduction under the same conditions.

EXAMPLE 3

Figure 4:
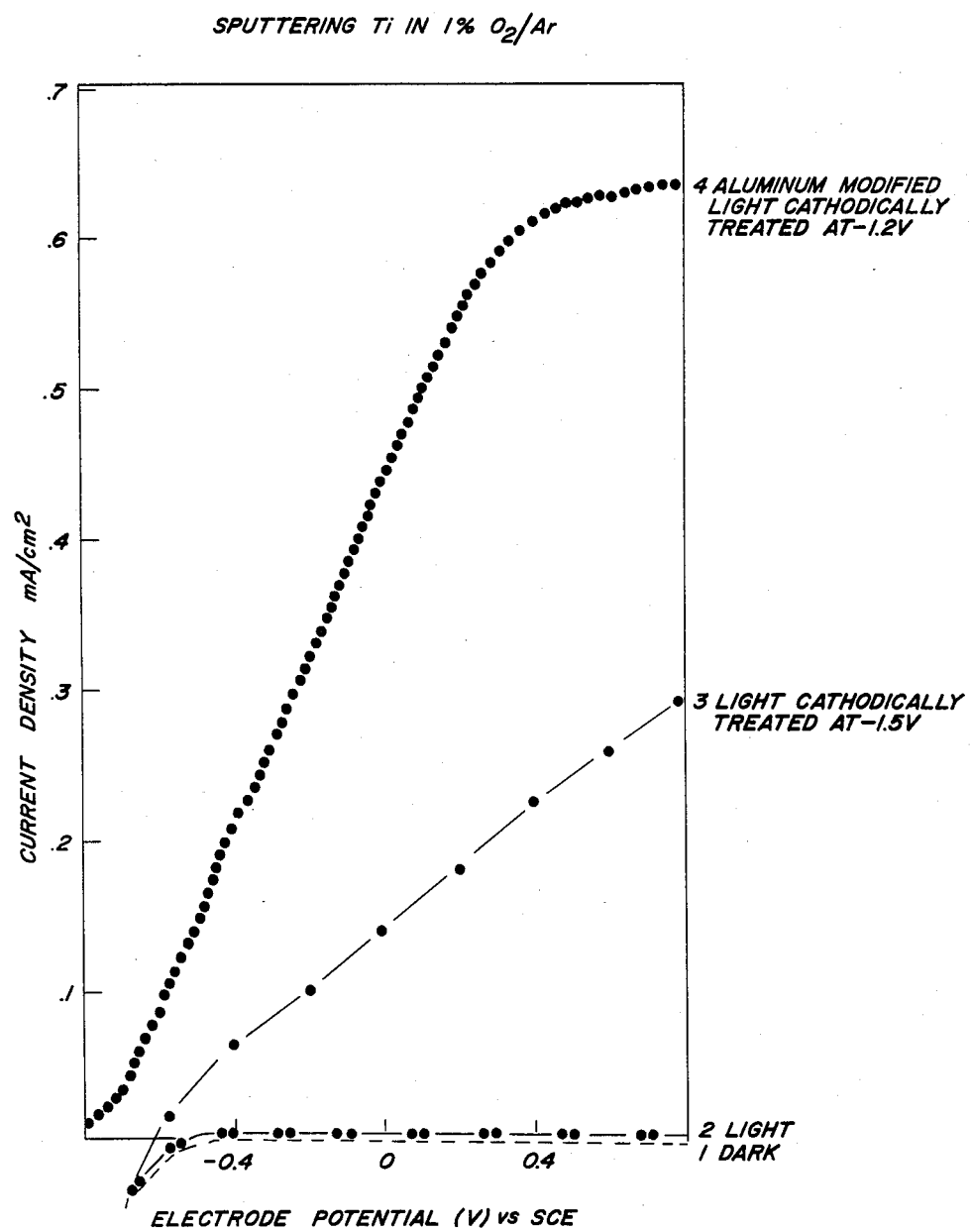
FIG. 4 is a plot of current density vs. electrode potential (vs. S.C.E.) for hydrogenated amorphous $TiO_2$ films illustrating the effect of a second compensating agent, aluminum.

A photoanode was prepared by reactive co-sputtering from a target composed of 95% titanium and 5% aluminum in a 1% oxygen/argon atmosphere onto a titanium substrate. The use of the compensating agent aluminum did not show any appreciable photoresponse when illuminated in 0.1N NaOH electrolyte with xenon lamp adjusted to 100 mw/cm$^2$. When the photoanode was cathodically treated at the potential region where hydrogen evolution takes place, a dramatic improvement in the photoresponse was noticed. This improvement is illustrated in FIG. 4. This dramatic increase was accomplished without annealing the modified film. It should be noted that the quantum efficiency was also double that of a hydrogenated sample without aluminum modification and that the photocurrent was stable for a prolonged period of time.

EXAMPLE 4

Figure 5:
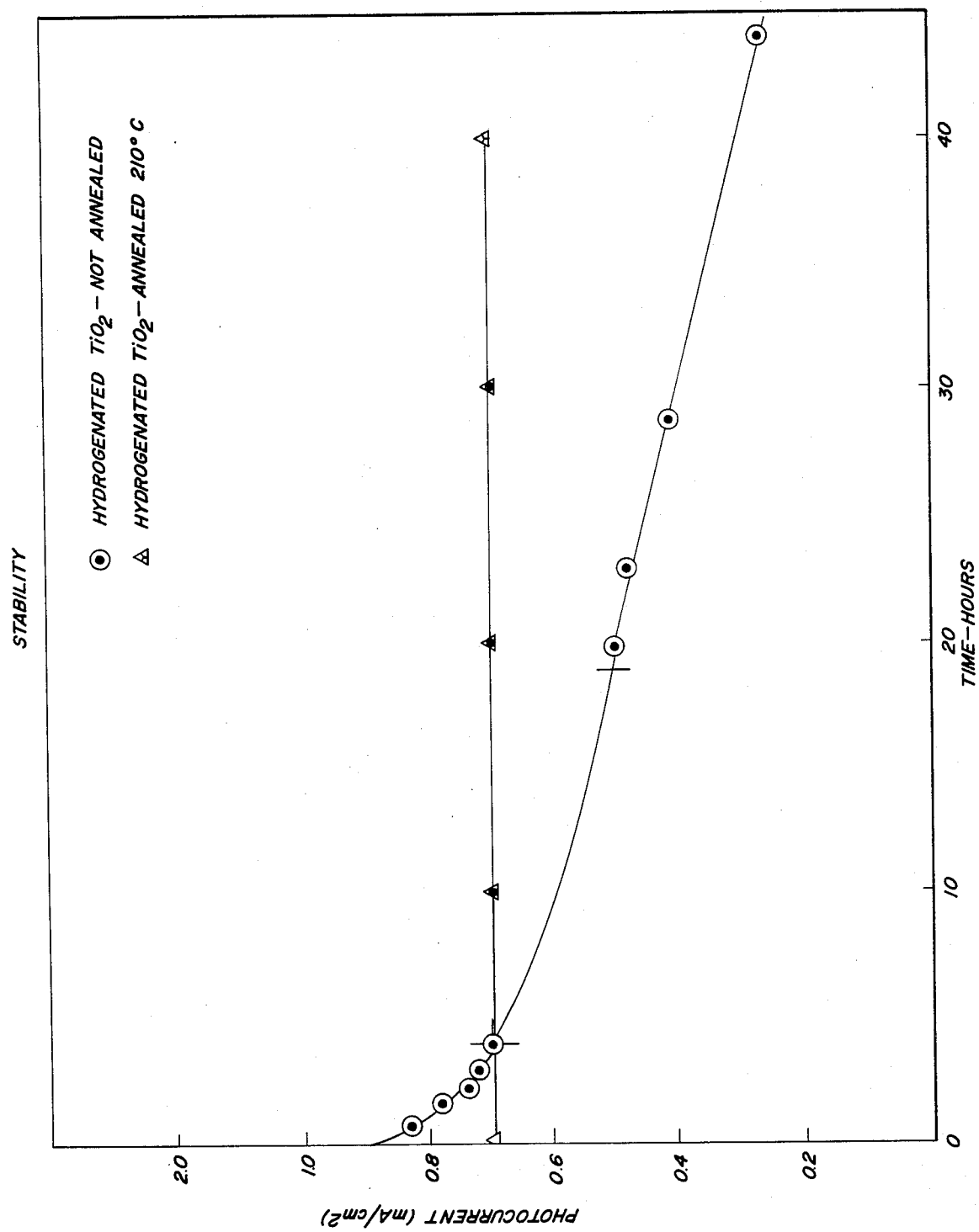
FIG. 5 is a plot of photocurrent vs. time (hours) for two hydrogenated amorphous $TiO_2$ films illustrating the stability imparted by annealing prior to cathodic treatment in accordance with the present invention.

Two photoanodes were prepared with amorphous $TiO_2$ films reactively sputtered on titanium substrates. Subsequently, one of the films was heated to a temperature of 210° C. for 10 minutes in an argon atmosphere. Both films were then hydrogenated. As illustrated in FIG. 5, the photocurrent of the heat treated or annealed film was very stable under continuous illumination for over 40 hours. Even after three months exposed to air, no degradation of the photocurrent was observed.

EXAMPLE 5

A photoanode having a tandem structure was made by depositing an amorphous film of $TiO_2$ approximately 0.2$\mu$ thick on a pressed pellet of $(CdS)_{0.77}(CdSe)_{0.23}$. The film was then electrochemically hydrogenated at room temperature. The stability of the low band semiconductor material was greatly enhanced without reducing the photoresponse of the low band gap material. No deterioration was observed for several hours at the most anodic potentials until pin holes in the very thin film (0.2$\mu$) allowed corrosion to slowly decrease the photoelectrochemical response. It is believed that a more uniform coating would result in even greater stability.

EXAMPLE 6

Three amorphous modified $TiO_2$ thin film photoanodes were prepared by reactive co-sputtering of titanium in 1% $O_2$/Ar atmosphere on a titanium substrate using aluminum as a compensating agent in one sample, silicon as a second modifying element on a second sample and both elements on a third sample. These films did not show the usual improvement in photocurrent consistent with the present invention; even after cathodic treatment of $-1.6$ v (vs. SCE) for 3 minutes. Both films were then annealed in an argon atmosphere at 960° C. which dramatically improved their photoelectrochemical properties. Subsequently, these films were hydrogenated and a further improvement in photoresponse resulted. The quantum efficiency of these samples for various wavelengths are presented in FIG. 6. The results for a single crystal $TiO_2$ annealed at 960° C. in a hydrogen atmosphere are also included for a comparison of the dramatic improvement achieved by the present invention.

EXAMPLE 7

Amorphous $TiO_2$ films reactively R.F. sputtered on a titanium substrate were chemically modified by soaking the photoanodes in either a saturated solution of $Fe(C_2O_4)_3$ or a solution of $Pr(NO_3)_3$ with nitric acid. After soaking, the photoanodes were annealed in an argon atmosphere at 850° C. for a ½ hour. The photospectral response of the two resulting photoanodes in 0.1N. NaOH at 0.0 v (SCE) is found in FIG. 7. Although the shift of the solar energy absorption range into the visible region was not as substantial for these chemically modified materials as for the materials modified by co-sputtering, chemical modification by soaking proves another simple and inexpensive method to improve the photoactivity of photoanodes.

Thus, the present invention contemplates two classes of modifiers. One class of modifiers includes hydrogen, lithium, fluorine, aluminum, other Group I elements, and compounds of these elements. These modifiers compensate or eliminate the localized states in the band gap of the amorphous semiconductor.

The second class of modifiers includes silicon, transition elements, lanthanides, and compounds of these elements. This second class of modifiers have appropriate energy levels in the band gap between conduction and valence band of the semiconductor and are also to shift its solar absorption range into the visible region.

As illustrated by these examples, an advantage of the amorphous materials of the present invention is that they are easier to make in comparison to the strict requirements discussed above for doping crystalline materials. Although localized states in the gap exist, they can be compensated or passivated by modification with a compensating agent.

Modifications and variations of the present invention are possible in light of the above teachings. It is therefore, to be understood that within the scope of the appended claims the invention may be practiced otherwise than as specifically described.

What is claimed is:

1. A method of making a photoresponsive amorphous semiconductor material comprising the steps of:
    forming an amorphous semiconductor;
    cathodically treating said amorphous semiconductor so that a compensating agent modifies the semiconductor to eliminate or compensate the localized states and enhance the photoresponse of the semiconductor.

2. A method as defined in claim 1, wherein said method further includes incorporating in said semiconductor a second compensating agent selected from the group consisting of hydrogen, lithium, fluorine, beryllium, aluminum, boron, magnesium, other Group I elements, and compounds of these elements, prior to said cathodically treating step.

3. A method as defined in claim 1, wherein said cathodically treating step includes:
    placing said semiconductor in electrical contact with an electrolyte; and subsequently,
    applying an electrical bias to said semiconductor.

4. A method as defined in claim 3, wherein said electrolyte is selected from the group consisting of potassium hydroxide, sodium hydroxide, and lithium hydroxide.

5. A method as defined in claim 3, wherein said electrical bias of the applying step is between about $-1.2$ to 2.0 volts for approximately 5 to 10 minutes.

6. A method as defined in claim 1, wherein said method further includes the step of heating said semiconductor prior to said cathodically treating step so that the photoresponse of the semiconductor is enhanced.

7. A method as defined in claim 6, wherein said semiconductor is heated in the range of approximately 200° C. to 400° C.

8. A method as defined in claim 1, wherein said semiconductor is selected from the group consisting of the oxides, sulfides, selenides, and phosphides of the transition elements.

9. A method as defined in claim 1, wherein said semiconductor is selected from the group consisting of $TiO_2$, $Fe_2O_3$, $SrTiO_2$, $WO_3$, and Si:F:H alloys.

10. A method as defined in claim 1, wherein the forming step further includes reactively sputtering said semiconductor on a substrate in an atmosphere of about 2.5% oxygen/argon, with sputtering power between about 0.5 and 2 watts/cm$^2$ and the temperature of said substrate between about 20° C. and 80° C.

11. A method as defined in claim 1, wherein said compensating agent is present in an amount of about 1 atomic percent.

12. A method as defined in claim 1, wherein said method further includes the step of incorporating in said semiconductor a modifying agent selected from the group consisting of silicon, transition elements, lanthanides, and compounds of these elements, prior to said treating step.

13. A method as defined in claim 12, wherein said modifying agent is selected from the group consisting of chromium, iron, niobium, silicon, and praseodymium.

14. A method as defined in claim 12, wherein said modifying agent is present in an amount of not more than about 20 atomic percent.

15. A method as defined in claim 12, wherein said incorporating step comprises reactively co-sputtering said modifying agent with the semiconductor during the forming step.

16. A method as defined in claim 12, wherein said incorporating step comprises soaking the semiconductor in a solution containing the modifying agent, prior to the treating step.

17. A photoresponsive amorphous semiconductor material for use in the conversion of light to electrical energy or fuel produced in accordance with the method defined in claim 1.

18. A photoanode having enhanced photoresponse for use in the conversion of light to electrical energy or fuel comprising:
a substrate including a deposition surface; and
an amorphous semiconductor film in electrical contact with said deposition surface, said semiconductor incorporating a compensating agent selected from the group consisting of hydrogen, lithium, fluorine, beryllium, aluminum, boron, magnesium, other Group I elements, and compounds of these elements, said semiconductor film being cathodically treated to enhance its photoresponse.

19. A photoanode as defined in claim 18, wherein said photoelectrode further includes a second semiconductor film in electrical contact with said deposition surface and positioned between said first semiconductor film and said deposition surface, so that said first semiconductor film provides a coating over said second semiconductor film.

20. A photoanode as defined in claim 19, wherein said second semiconductor film comprises a smaller band gap semiconductor.

21. A photoanode as defined in claim 20, wherein said smaller band gap semiconductor is selected from the group consisting of CdS, CdSe, and compounds thereof.

22. A photoanode as defined in claim 18, wherein said semiconductor film is annealed prior to said cathodic treatment to enhance its photoresponse.

23. A photoanode as defined in claim 18, wherein said semiconductor is selected from the group consisting of the oxides, sulfides, selenides, and phosphides of the transition elements.

24. A photoanode as defined in claim 18, wherein said semiconductor is selected from the group consisting of $TiO_2$, $Fe_2O_3$, $SrTiO_2$, $WO_3$ and Si:F:H alloys.

25. A photoanode as defined in claim 18, wherein said compensating agent is present in an amount of about 1 atomic percent.

26. A photoanode as defined in claim 18, wherein said semiconductor further includes a modifying agent selected from the group consisting of silicon, transition elements, lanthanides, and compounds of these elements.

27. A photoanode as defined in claim 26, wherein said modifying agent is selected from the group consisting of chromium, iron, niobium, silicon, and praseodymium.

28. A photoanode as defined in claim 26, wherein said modifying agent is present in an amount of not more than about 20 atomic percent.

29. A photoanode as defined in claim 18, wherein said substrate is a material selected from the group consisting of titanium, stainless steel, nickel, and NESA glass.

30. A photoelectrochemical cell for the conversion of light into electrical energy or energy stored in a fuel comprising:
a cell having an interior space therein, said space divided by a membrane positioned in said space to form an anode compartment and a counter electrode compartment within said cell,
an electrolyte in said anode compartment and in said counter electrode compartment;
a counter electrode positioned in said counter electrode compartment with at least a portion in contact with said electrolyte;
a photoanode positioned in said anode compartment with at least a portion in contact with said electrolyte;
said photoanode including a substrate having a deposition surface, and an amorphous semiconductor film in electrical contact with said deposition surface, said semiconductor film including a compensating agent selected from the group consisting of hydrogen, lithium, fluorine, beryllium, aluminum, boron, magnesium, other Group I elements, and compounds of these elements, said semiconductor film being cathodically treated to enhance its photoresponse; and
means for allowing light to enter the cell and illuminate said photoelectrode wherein the light will be converted into energy usable as electricity or a fuel.

31. A cell as defined in claim 30, wherein said cell further includes an electrical load electrically coupled to said photoanode and counter electrode, whereby the light is converted into electrical energy.

32. A cell as defined in claim 30, wherein said cell further includes an electrical power source electrically coupled to said photoanode and counter electrode, whereby photoassisted electrolysis will occur.

33. A cell as defined in claim 30, wherein said semiconductor film is further annealed prior to said cathodic treatment to enhance its photoresponse.

34. A cell as defined in claim 30, wherein said semiconductor is selected from the group consisting of the oxides, sulfides, selenides, and phosphides of the transition elements.

35. A cell as defined in claim 30, wherein said semiconductor is selected from the group consisting of $TiO_2$, $Fe_2O_3$, $SrTiO_2$, $WO_3$ and a-Si:F:H alloys.

36. A cell as defined in claim 30, wherein said compensating agent is present in an amount of about 1 atomic percent.

37. A cell as defined in claim 30, wherein said amorphous semiconductor film further includes a modifying agent selected from the group consisting of silicon, transition elements, lanthanides, and compounds of these elements.

38. A cell as defined in claim 37, wherein said modifying agent is selected from the group consisting of chromium, iron, niobium, silicon, and praseodymium.

39. A cell as defined in claim 37, wherein said modifying agent is present in an amount of not more than about 20 atomic percent.

40. A cell as defined in claim 30, wherein said photoanode further includes a second semiconductor film in electrical contact with said deposition surface and positioned between said first semiconductor film and said deposition surface, so that said first semiconductor film provides a coating over said second semiconductor film.

41. A cell as defined in claim 40, wherein said second semiconductor film comprises a smaller band gap semiconductor.

42. A cell as defined in claim 41, wherein said smaller band gap semiconductor is selected from the group consisting of CdS, CdSe, and compounds thereof.

* * * * *

UNITED STATES PATENT AND TRADEMARK OFFICE
CERTIFICATE OF CORRECTION

PATENT NO. : 4,511,638
DATED : April 16, 1985
INVENTOR(S) : K. Sapru et al.

It is certified that error appears in the above-identified patent and that said Letters Patent is hereby corrected as shown below:

Column 1, line 58, delete "coduction" and insert --conduction--.

Column 1, line 60, delete "bank" and insert --band--.

Column 2, line 15, delete "creatng" and insert --creating--.

Column 5, line 40, delete "ae" and insert --are--.

Column 5, line 48, after "utilized" insert --in the--.

Column 8, line 5, delete "100 ms/cm$^2$" and insert --100 mw/cm$^2$--.

Signed and Sealed this

Fifteenth Day of October 1985

[SEAL]

Attest:

*Attesting Officer*

DONALD J. QUIGG

*Commissioner of Patents and Trademarks—Designate*